(12) United States Patent
Toda

(10) Patent No.: US 8,330,950 B2
(45) Date of Patent: *Dec. 11, 2012

(54) METHOD OF MANUFACTURING NITRIDE SEMICONDUCTOR DEVICE INCLUDING SIC SUBSTRATE AND APPARATUS FOR MANUFACTURING NITRIDE SEMICONDUCTOR DEVICE

(75) Inventor: Fumihiko Toda, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 1268 days.

This patent is subject to a terminal disclaimer.

(21) Appl. No.: 12/076,837

(22) Filed: Mar. 24, 2008

(65) Prior Publication Data

US 2008/0246959 A1 Oct. 9, 2008

Related U.S. Application Data

(62) Division of application No. 10/932,028, filed on Sep. 2, 2004, now Pat. No. 7,384,803.

(30) Foreign Application Priority Data

Sep. 4, 2003 (JP) .................... 2003-313023

(51) Int. Cl.
*G01N 21/00* (2006.01)
*H01L 21/60* (2006.01)
(52) U.S. Cl. .............. 356/237.5; 438/14; 438/16
(58) Field of Classification Search ............ None
See application file for complete search history.

(56) References Cited

U.S. PATENT DOCUMENTS

| 6,100,104 | A | 8/2000 | Haerle |
| 6,521,467 | B2 | 2/2003 | Laureanti |
| 6,934,920 | B2* | 8/2005 | Fujii et al. .......... 716/136 |
| 7,001,457 | B2 | 2/2006 | Sarayama |
| 7,384,803 | B2* | 6/2008 | Toda .................. 438/14 |
| 2004/0206891 | A1 | 10/2004 | Ma et al. |

FOREIGN PATENT DOCUMENTS

| JP | 09-064136 | 3/1997 |
| JP | 2002-151560 | 5/2002 |
| JP | 2003-012400 | 1/2003 |

OTHER PUBLICATIONS

"Video Enhance System SMR-100", catalog from NIKON (as of Aug. 1994).
JP Office Action issued Aug. 28, 2007, in JP 2003-313023, along with English translation.
"Properties of GaN Grown at High Rates on Sapphire and on 6H-SiC", S. Fisher et al.; Lawrence Berkeley National Laboratory and University of California; Aug. 20, 1996.
"Photoluminescence Intensity and Spectral Distribution of GaN Films on SiC Substrates—The Dependence on Dislocation Density and Structure", P. Hacke, et al.; Fujitsu Laboratories Ltd.I 216, 639, Jul. 4, 1999.

* cited by examiner

*Primary Examiner* — Gregory J Toatley
*Assistant Examiner* — Amanda Merlino
(74) *Attorney, Agent, or Firm* — Rabin & Berdo, P.C.

(57) ABSTRACT

Excitation light is irradiated onto a GaN layer on a silicon carbide substrate constituting a layered product that is set on a stage. Then light is emitted from a defective part caused by a structural defect of the silicon carbide substrate out of the GaN layer. By using this light luminescence phenomena, a position of a defective part of the silicon carbide substrate can be detected.

6 Claims, 10 Drawing Sheets

10 : EXCITATION LIGHT IRRADIATION SECTION
20 : DEFECTIVE PART SPECIFICATION SECTION
100 : SUBSTRATE INSPECTION DEVICE

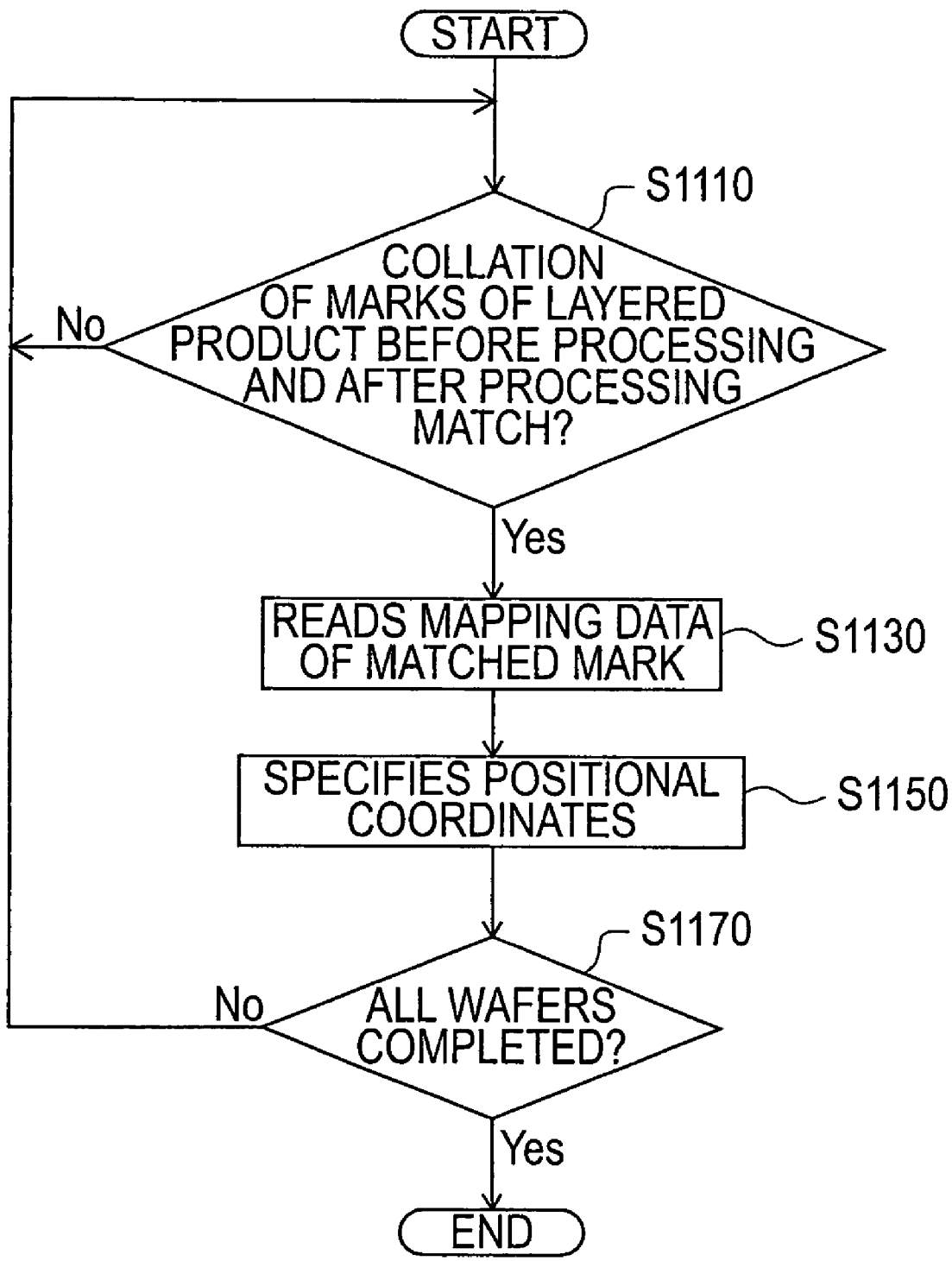

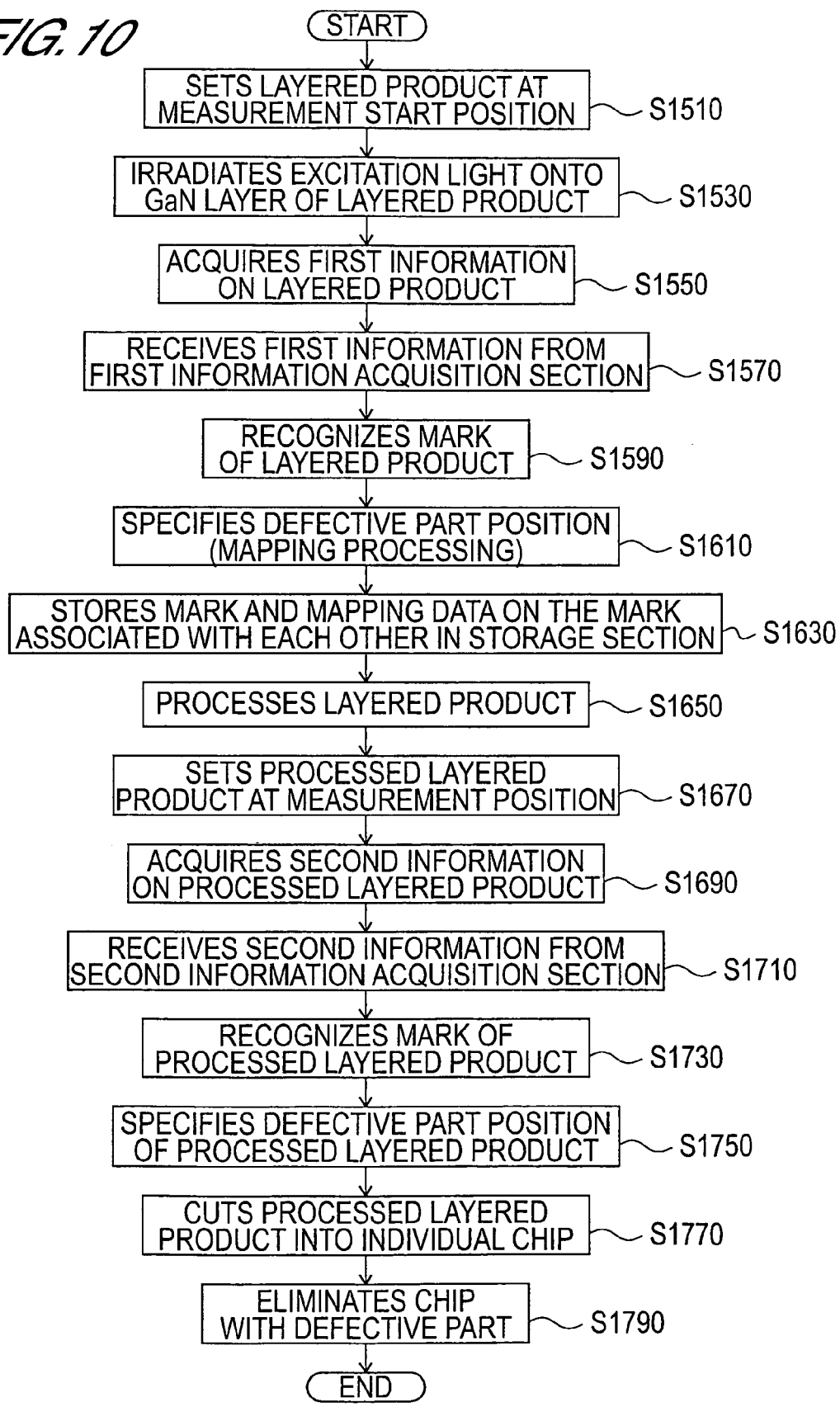

METHOD OF MANUFACTURING NITRIDE SEMICONDUCTOR DEVICE INCLUDING SIC SUBSTRATE AND APPARATUS FOR MANUFACTURING NITRIDE SEMICONDUCTOR DEVICE

This application is a continuation of U.S. patent application Ser. No. 10/932,028, filed Sep. 2, 2004, the subject matter of which application is incorporated herein by reference in its entirety.

BACKGROUND OF THE INVENTION

1. Field of the Invention

The present invention relates to a substrate inspection method and substrate inspection device that are suitable for use in a silicon carbide (SiC) substrate constituting a nitride semiconductor device, and a method of manufacturing the nitride semiconductor device and an apparatus for manufacturing for the nitride semiconductor device using the substrate inspection method and the substrate inspection device.

2. Description of Related Art

At the moment, research on nitride semiconductors is actively progressing in the fields of optical devices and electronic devices because of advantages in physical characteristics.

In particular, in the electronic device field, the development of high electron mobility transistors (hereafter called "HEMT") using nitride semiconductors is now in progress.

In the case of nitride semiconductor crystals, growing bulk single crystals is difficult because vapor pressure is high, so metal-organic chemical vapor deposition (hereafter called MOCVD) is widely used.

The MOCVD method is an epitaxial growth technology for forming a desired crystal layer on a substrate by sequentially supplying predetermined material gas onto the substrate under high temperature.

Recently in the electronic device field, a silicon carbide substrate (hereafter also called SiC substrate) is receiving attention. This is because the thermal conductivity of SiC is high, about 7-9 times the thermal conductivity of sapphire ($Al_2O_3$), which is generally used as the substrate material.

So now the technical development of HEMT, which can be obtained by growing nitride semiconductor crystals on the SiC substrate by the MOCVD method, and which has superb high frequency characteristics and high output characteristics, is on-going.

For example, according to the "Video Enhance System SMR-100" catalog from Nikon (as of August, 1994), the visual inspection of a manufactured HEMT can be performed by optical microscopic images.

However depositing a nitride semiconductor thin film on the SiC substrate by the abovementioned MOCVD method has the following problems.

First, in the SiC substrate as a crystal substrate, holes called micro-pipes, which penetrate from the front to the back of the substrate, exist as structural defects. The diameter of a micro-pipe differs depending on the growth conditions of single crystals, but is several µm to several tens µm in some cases.

Therefore if the film thickness of the nitride semiconductor thin film grown on the SiC substrate is normally 2 µm-3 µm, a part of the micro-pipes remain as defects after the thin film is grown.

In other words, the structural defects of the SiC substrate causes the generation of defects in the nitride semiconductor thin film on this substrate (this is called defect propagation).

Also in the SiC substrate, various structural defects exist in some cases, other than the abovementioned micro-pipes, such as macro defects (e.g. voids, grain boundaries), dislocations (e.g. spirals, blades, mosaics) and surface defects (surface polishing scratches, surface roughness). In these cases as well, a defect is propagated into the nitride semiconductor thin film deposited thereon.

HEMT, which has an SiC substrate with such structural defects, causes operation failures, which drops the reliability as a device.

However the inspection by the system shown in the abovementioned document is not the detection of structural defects but is merely a visual inspection for observing the surface of the device and dimensional errors, and it is impossible to inspect the quality of the device by detecting the abovementioned structural defects.

With the foregoing in view, it is an object of the present invention to provide a substrate inspection method and a substrate inspection device that can detect the structural defects generated inside the substrate, and a manufacturing method for a nitride semiconductor device and a manufacturing device for a nitride semiconductor device which use this substrate inspection method and substrate inspection device.

SUMMARY OF THE INVENTION

To achieve this object, the method of manufacturing a nitride semiconductor device according to the present invention comprises the following steps.

The method is for manufacturing a nitride semiconductor device which is comprised of a layered product where a nitride semiconductor thin film is deposited on a silicon carbide substrate, comprising an irradiation step, a defective part specification step, a cutting step and an elimination step. In the irradiation step, an excitation light is irradiated onto the nitride semiconductor thin film. In the defective part specification step, a position of the defective part of the silicon carbide substrate, generated in the nitride semiconductor thin film by the irradiation of excitation light, is specified using the light based on the defect of the silicon carbide substrate. In the cutting step, the processed layered product, after the layered product is processed, is cut at each predetermined device dimension to create a plurality of chips. In the elimination step, chips having the defective part at the specified position is eliminated from the chips.

By this, the luminescence phenomena, which is generated based on the defect of the nitride semiconductor thin film, is detected using a simple configuration with an optical microscope, and the position of the defective part of the nitride semiconductor thin film can be detected.

As a result, the position of the defective part of the SiC substrate, having a defect that causes defect propagation to the nitride semiconductor thin film, can be specified.

Since the position of the defective part of the SiC substrate of the processed layered product can be specified using the position of the defective part which was specified in the layered product before processing, a chip having the defective part can be eliminated.

It is preferable that the defective part specification step further comprises a step of detecting the light emitting in the nitride semiconductor thin film and acquiring first information including information on the intensity of the light, and a step of specifying an area where the intensity of the light among the first information is a reference value or above as a defective part.

By this, in addition to the abovementioned effects, mapping data, which is data on the defective position and non-defective position of the nitride semiconductor thin film, can be acquired quickly and with good reproducibility. As a result, the position of the defective part of the SiC substrate can be specified automatically and efficiently.

It is preferable that a mark, which can be identified from the outside, is formed on the layered product in advance. Further the mark is recognized from first information, and then the first information and the identified mark are associated with each other and stored in a storage section. In the defective part specification step, a second information on a mark that the processed layered product has is acquired, then the first information, that is stored associating with a mark the same as the mark of the processed layered product identified by the second information, is read and collated, and the defective position of the processed layered product is specified based on the information that was read.

By this, in addition to the abovementioned effects, the position of the defective part of the SiC substrate of the wafer type processed layered product can be specified using the mapping data, which was acquired in advance before processing the layered product, so it is unnecessary to specify the defective position again after processing.

Therefore chips having a defective part in the SiC substrate can be efficiently selected from the chips obtained by cutting this processed layered product.

It is preferable that the manufacturing method further comprises a processing step for processing the film for forming the nitride semiconductor device on the layered product, so that the mark of the processed layered product can be maintained in the status to be identifiable from the outside, when the mark of the processed layered product is recognized.

By this, in addition to the abovementioned effect, the mark of the processed layered product can be recognized at high precision.

The method of manufacturing a nitride semiconductor device according to the present invention comprises the following steps.

In other words, the manufacturing method for a nitride semiconductor device, which comprises a layered product where the nitride semiconductor thin film is deposited on the silicon carbide substrate, comprises an irradiation step, a defective part specification step, a processing step, a cutting step and an elimination step. In the irradiation step, the excitation light is irradiated onto the nitride semiconductor thin film. In the defective part specification step, a position of the defective part of the silicon carbide substrate is specified using the light based on the defects of the silicon carbide substrate generated in the nitride semiconductor thin film by irradiation of the excitation light. In the processing step, the processing is performed on an area other than the defective part out of the layered product, and the processed layered product is formed. In the cutting step, the layered product, including the processed layered product, is cut at each predetermined device dimension to create a plurality of chips. In the elimination step, chips, other than the chips including the processed layered product, are eliminated from the chips.

By this, the position of the defect of the nitride semiconductor thin film can be detected by detecting the luminescence phenomena that is generated based on the defect of the nitride semiconductor thin film using a simple configuration with an optical microscope.

As a result, a position of the defective part of the SiC substrate, which has defects that cause defect propagation to the nitride semiconductor thin film, can be specified.

Therefore by processing only the SiC substrate portion, which does not have a defective part of the layered product, unnecessary chips which do not include the processed layered product can be eliminated after cutting the layered product.

It is preferable that in the defective part specification step, light emitting in the nitride semiconductor thin film is detected, and first information, including information on the intensity of the light, is acquired, and an area where the intensity of the light is a reference value or above is specified as the defective part from the first information.

By this, in addition to the abovementioned effect, the mapping data, which is data on the defective position and non-defective position of the nitride semiconductor thin film, can be acquired quickly with good reproducibility. As a result, the position of the defective part of the SiC substrate can be specified automatically and efficiently.

It is preferable that the visible light of which wavelength is 400 to 600 nm is irradiated as the excitation light.

By this, in addition to the abovementioned effect, the visible light can be irradiated not only onto the defects of the surface layer of the nitride semiconductor thin film but also onto the defects existing inside.

It is preferable that the ultraviolet light is irradiated.

By this, in addition to the abovementioned effect, only the luminescence caused by the defects of the nitride semiconductor thin film can be detected. If dirt and dust are attached to the surface of the nitride semiconductor thin film, luminescence from the surface becomes weaker since the emitted light is blocked by this dirt and dust, so this dirt and dust can also be observed at the same time.

This method of manufacturing is preferably applied to the SiC substrate on which one type or two or more types of films selected from a GaN layer, AlGaN layer and InGaN layer are deposited as the nitride semiconductor thin film.

By this, various nitride semiconductor thin films can be used alone or combined, so the quality of the SiC substrate constituting such nitride semiconductor devices as high frequency and high output transistors, blue lasers and blue light emitting diodes, including HEMT, can be evaluated.

The apparatus for manufacturing the nitride semiconductor device according to the present invention has the following features in the configuration.

The apparatus for manufacturing a nitride semiconductor device comprises an excitation light irradiation section for irradiating excitation light onto a nitride semiconductor thin film out of a layered product where the nitride semiconductor thin film is deposited on a silicon carbide substrate, a defective part specification section for specifying a position of a defective part of the silicon carbide substrate using light based on the defect of the silicon carbide substrate generated in the nitride semiconductor thin film by the excitation light, a cutting section for processing the layered product and then cutting the processed layered product at each predetermined dimension to create a plurality of chips, and an elimination section for eliminating chips having the defective part from the chips.

According to this configuration of the apparatus for manufacturing a nitride semiconductor device, the position of the defective part of the nitride semiconductor thin film can be detected by detecting the luminescence phenomena that is generated based on the defects of the nitride semiconductor thin film using a simple configuration with an optical microscope.

As a result, a position of the defective part of an SiC substrate which has detects that will cause defect propagation to the nitride semiconductor thin film can be specified.

Since the position of the defective part of the SiC substrate of the processed layered product can be specified using the position of the defective part which is specified in the layered product before processing, a chip having the defective part can be eliminated.

It is preferable that the defective part specification section further includes a first information acquisition section for detecting the light emitting in the nitride semiconductor thin film and acquiring first information including information on the intensity of the light, and an information processing section for specifying an area where the intensity of the light is a reference value or above as a defective part.

By this, in addition to the abovementioned effects, the position of the defective part of the SiC substrate of the wafer type processed layered product can be specified using the mapping data, which was acquired in advance before processing the layered product, so it is unnecessary to specify the defective position again after processing.

Therefore a chip having a defective part in the SiC substrate can be efficiently selected from the chips obtained by cutting this processed layered product.

It is preferable that the apparatus for manufacturing further comprises a second information acquisition section for acquiring a second information on a mark formed on the processed layered product when the mark, which can be identified from the outside, is formed on the layered product in advance, and the defective part specification section further comprises a first recognition section for recognizing the mark from the first information, a storage section for storing the first information and the mark recognized by the first recognition section associating with each other, a second recognition section for recognizing a mark, that the processed layered product has, based on the second information acquired by the second information acquisition section, and a defective part collation section for reading and collating the first information, that is stored associated with a mark the same as the mark of the recognized processed layered product, from the storage section, and specifying a defective part of the processed layered product based on the first information that was read.

By this, in addition to the abovementioned effects, the position of the defective part of the SiC substrate of the wafer type processed layered product can be specified using the mapping data, which was acquired in advance before processing the layered product, so it is unnecessary to specify the defective position after processing.

Therefore a chip having a defective part in the SiC substrate can be efficiently selected from the chips obtained by cutting this processed layered product.

It is preferable that the apparatus for manufacturing further comprises a processing section for processing the film for forming a nitride semiconductor device on the layered product so that the mark of the processed layered product can be maintained in the status to be identifiable from the outside, when the mark of the processed layered product is recognized.

By this, in addition to the abovementioned effect, the mark of the processed layered product can be recognized at high precision.

It is preferable that the excitation light irradiation section irradiates the visible light of which wavelength is 400 to 600 nm.

By this, in addition to the abovementioned effect, the visible light can be irradiated not only onto the defects on the surface layer of the nitride semiconductor thin film, but also onto the defects existing inside.

It is preferable that the excitation light irradiation section is constructed such that the ultraviolet light is irradiated.

By this, in addition to the abovementioned effect, only the luminescence caused by the defects of the nitride semiconductor thin film can be detected. If dirt and dust are attached to the surface of the nitride semiconductor thin film, luminescence from the surface becomes weaker since the emitted light is blocked by this dirt and dust, so this dirt and dust can also be observed at the same time.

This apparatus is preferably applied to a nitride semiconductor thin film which includes one type or two or more types of layers selected from a GaN layer, AlGaN layer and InGaN layer.

The abovementioned apparatus can be applied to substrates where various nitride semiconductor thin films are used alone or combined, so the quality of the SiC substrate constituting such nitride semiconductor devices as high frequency and high output transistors, blue lasers and blue light emitting diodes, including HEMT, can be evaluated. Also the substrate inspection method according to the present invention comprises the following steps.

The excitation light is irradiated onto a nitride semiconductor thin film deposited on a silicon carbide substrate, and a position of a defective part of the silicon carbide substrate is detected using light based on the defect of the silicon carbide substrate generated in the nitride semiconductor thin film by the detected excitation light. By this, the luminescence phenomena, which is generated based on the defect of the nitride semiconductor thin film, is detected using a simple configuration with an optical microscope, and the position of the defect of the nitride semiconductor thin film can be detected.

As a result, the position of the defective part of the silicon carbide substrate (hereafter may simply be called SiC substrate), having a defect that causes defect propagation to the nitride semiconductor thin film, can be specified.

It is preferable that the light emitting in the nitride semiconductor thin film is detected and information on the intensity of the light is acquired, and an area where the intensity of the light is a reference value or above is specified as a defective part from this information.

By this, in addition to the abovementioned effects, mapping data, which is data on the defective position and non-defective position of the nitride semiconductor thin film, can be acquired quickly and with good reproducibility.

As a result, the position of the defective part of the SiC substrate can be specified automatically and efficiently.

It is preferable that the excitation light is irradiated onto the entire surface of the nitride semiconductor thin film.

By this, in addition to the abovementioned effect, a position of the defective part can be specified for the entire surface of the nitride semiconductor thin film sample, and the quality of the SiC substrate can be evaluated for the entire sample.

It is preferable that the visible light of which the wavelength is 400 to 600 nm is irradiated.

By this, in addition to the abovementioned effect, the visible light can be irradiated not only onto the defects on the surface layer of the nitride semiconductor thin film, but also onto the defects existing inside.

It is preferable that ultraviolet light is irradiated.

By this, in addition to the abovementioned effect, only the luminescence caused by the defect of the nitride semiconductor thin film can be detected. If dirt and dust are attached to the surface of the nitride semiconductor thin film, luminescence from the surface becomes weaker since the emitted light is blocked by this dirt and dust, so this dirt and dust can also be observed at the same time.

The inspection method of the present invention is preferably applied to a substrate on which one type or two or more types of layers selected from a GaN layer, AlGaN layer and InGaN layer are deposited as the nitride semiconductor thin film.

By this, various nitride semiconductor thin films can be used alone or combined, so the quality of the SiC substrate constituting such nitride semiconductor devices as high frequency and high output transistors, blue lasers and blue light emitting diodes, including HEMT, can be evaluated.

The substrate inspection device according to the present invention has the following features in the configuration.

The substrate inspection device comprises an excitation light irradiation section for irradiating the excitation light onto a nitride semiconductor thin film deposited on a silicon carbide substrate, and a defective part specification section for specifying a position of a defect of a silicon carbide substrate using light based on the defect of the silicon carbide substrate generated in the nitride semiconductor thin film by the excitation light.

By this, the luminescence phenomena, which is generated based on the defect of the nitride semiconductor thin film, is detected using a simple configuration with an optical microscope, and the position of the defect of the nitride semiconductor thin film can be detected.

As a result, the position of the defective part of the SiC substrate having a defect, that will cause defect propagation to the nitride semiconductor thin film, can be specified.

It is preferable that the defective part specification section further comprises an information acquisition section for detecting the light emitting in the nitride semiconductor thin film and acquiring information on the intensity of the light, and an information processing section for specifying an area where the intensity of the light is a reference value or above as a defective part from this information.

By this, in addition to the abovementioned effects, mapping data, which is data on the defective position and non-defective position of the nitride semiconductor thin film, can be acquired quickly and with good reproducibility.

As a result, the position of the defective part of the SiC substrate can be specified automatically and efficiently.

It is preferable that the excitation light from the excitation light irradiation section is irradiated onto the entire surface of the nitride semiconductor thin film.

By this, in addition to the abovementioned effect, a position of the defective part can be specified for the entire surface of the nitride semiconductor thin film sample, and the quality of the SiC substrate can be evaluated for the entire sample.

It is preferable that the excitation light irradiation section irradiates the visible light, of which wavelength is 400 to 600 nm.

By this, in addition to the abovementioned effect, the visible light can be irradiated not only onto the defects on the surface layer of the nitride semiconductor thin film, but also onto the defects existing inside.

It is preferable that the excitation light irradiation section irradiates the ultraviolet light as the excitation light.

By this, in addition to the abovementioned effect, only the luminescence caused by the defect of the nitride semiconductor thin film can be detected. If dirt and dust are attached to the surface of the nitride semiconductor thin film, luminescence from the surface of the nitride semiconductor thin film becomes weaker since the emitted light is blocked by the dirt and dust, so this dirt and dust can also be observed at the same time.

The inspection device is preferably applied to a substrate which includes one type or two or more types of layers selected from a GaN layer, AlGaN layer and InGaN layer as the nitride semiconductor thin film.

By this, various nitride semiconductor thin films can be used alone or combined, so the quality of the SiC substrate constituting such nitride semiconductor devices a high frequency and high output transistors, blue lasers and blue light emitting diodes, including HEMT, can be evaluated.

BRIEF DESCRIPTION OF THE DRAWINGS

The foregoings and other objects, features and advantageous of the present invention will be better understood from the following description taken in connection with the accompanying drawings, in which:

FIG. 9 is a flow chart depicting the operation of the defective part collation section of the manufacturing device for a nitride semiconductor device of the fourth embodiment of the present invention; and FIG. 10 is a flow chart depicting the manufacturing method by the manufacturing device for a nitride semiconductor device of the fourth embodiment of the present invention.

DESCRIPTION OF THE PREFERRED EMBODIMENTS

Figure 1:
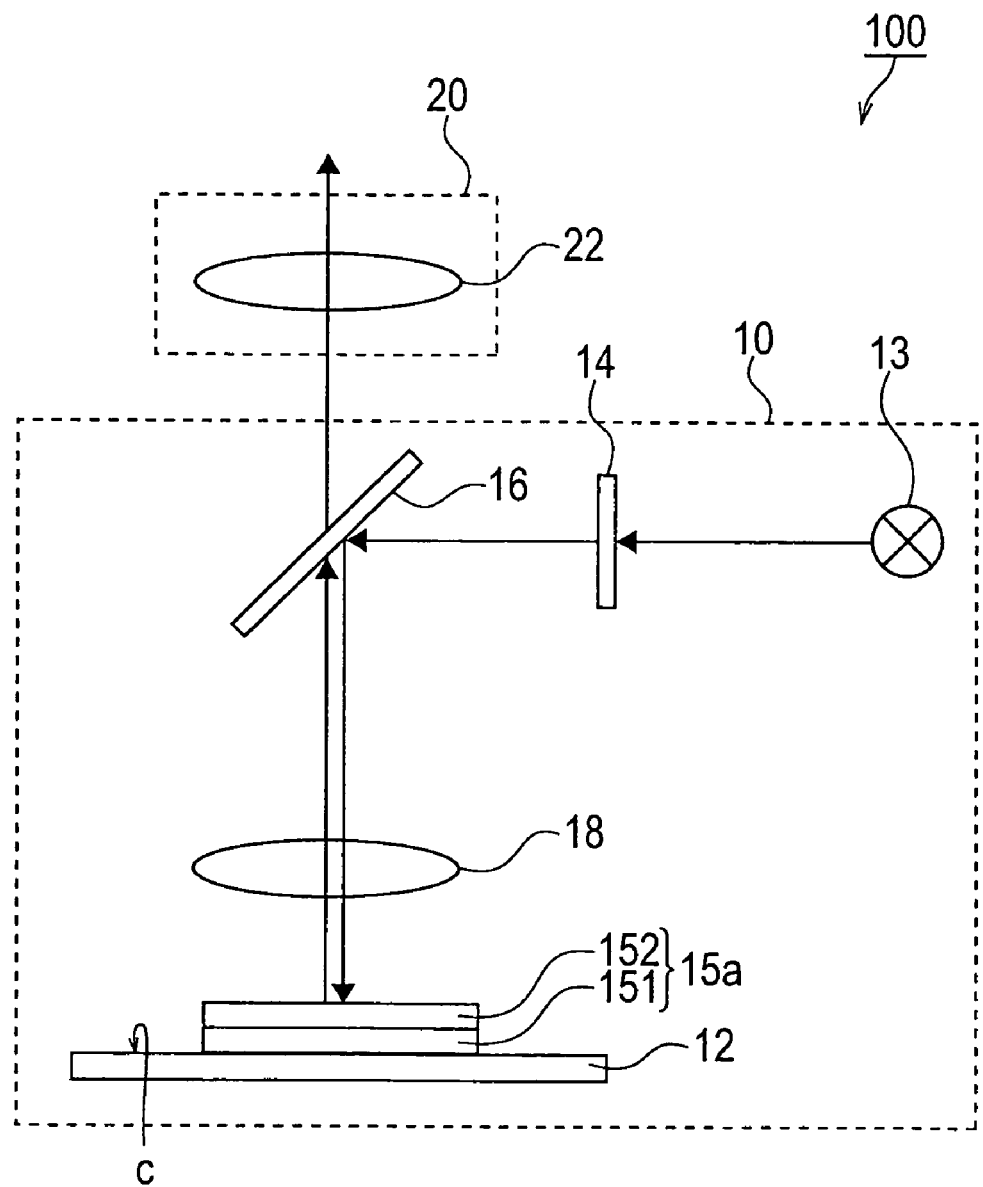
FIG. 1 is a diagram depicting the configuration of the substrate inspection device according to the first embodiment of the present invention.

Embodiments of the present invention will now be described with reference to FIG. 1 to FIG. 10. Each drawing (excluding the flow charts) shows the shape, size and positional relationship of each constitutional element rough enough to assist in understanding the present invention, and therefore the present invention is not limited to the illustrated examples. To simplify the drawings, hatching to indicate a cross-section shows only part of the cross-section, the rest of the cross-section is omitted. The following description is simply on the preferred embodiments, and numerical conditions shown there are not limited to these. In each drawing, similar constitutional elements are denoted with the same reference numerals, and redundant description thereof may be omitted.

First Embodiment

FIG. 1 is a diagram depicting the configuration of the substrate inspection device 100 of the present embodiment. In the present embodiment, the case when the layered product 15a, where a GaN layer 152 is deposited as a nitride semiconductor thin film on the wafer type silicon carbide (SiC) substrate 151 is used, will be described as an example.

As FIG. 1 shows, the substrate inspection device 100 of the present embodiment comprises an excitation light irradiation section 10 and a defective part specification section 20. The defective part is an area of the SiC substrate that has a structural defect, and here the area emitting light at the light intensity that is at least a predetermined standard value, which will be described later, will be handled as the defective part.

The excitation light irradiation section 10 irradiates the excitation light onto the GaN layer 152 as the nitride semiconductor thin film that the layered product 15a has.

Here the excitation light irradiation section 10 comprises a stage 12 on which the layered product 15a is placed, a light source 13, a narrowband filter 14, a half mirror 16 and a first lens 18.

In a direction substantially vertical to the mounting face c of the stage 12, the first lens 18 and half mirror 16 are sequentially disposed from the stage 12 side with a predetermined space. The half mirror 16 is disposed at a position where the incident angle of the excitation light from the light source 13, which transmitted through the narrowband filter 14, is 45°. The excitation light enters the layered product 15a on the stage 12 at incident angle 90° via the first lens 18.

In this configuration example, a mercury lamp, which can irradiate blue to green visible light (wavelengths of about 400-600 nm) for example, is used as the light source 13. The excitation light is an e-line (wavelength 546 nm) or g-line (wavelength 436 nm).

The defective part specification section 20 has a second lens 22. The second lens 22 forms an image of the light emitted from the GaN layer 152 of the layered product 15a (described later).

Figure 2:
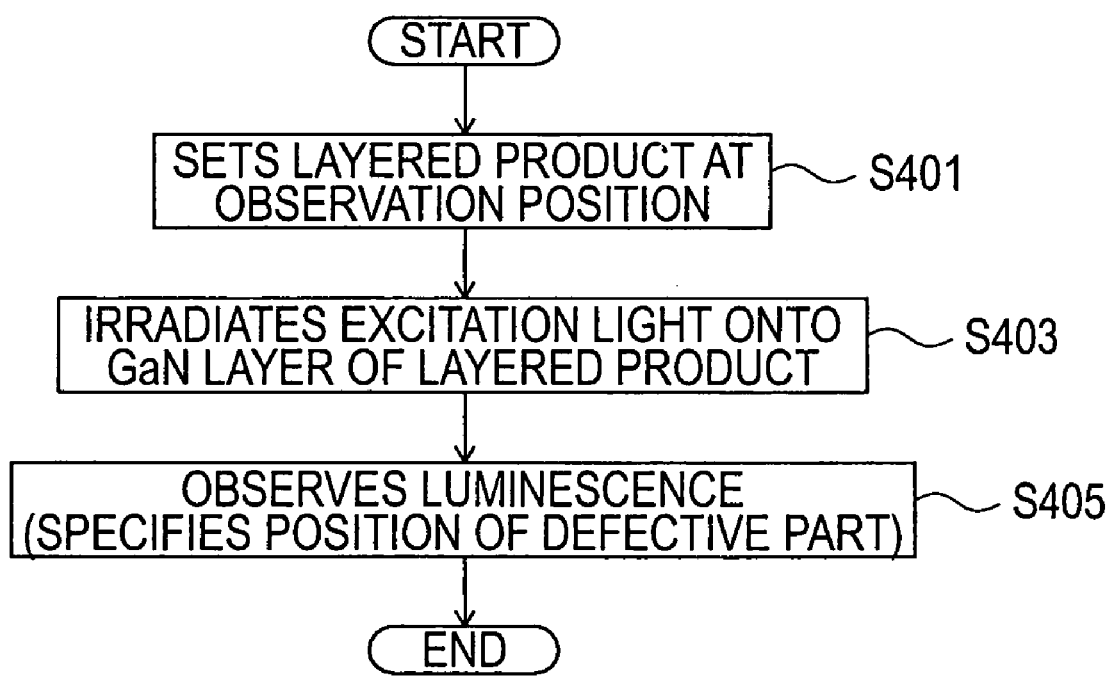
FIG. 2 is a flow chart depicting the inspection method using the substrate inspection device of the first embodiment of the present invention.

Now the substrate inspection method using the substrate inspection device 100 will be described with reference to FIGS. 1 and 2.

At first, the stage 12 on which the wafer type layered product 15a is placed is set at the observation position (S401).

Then the excitation light from the light source 13 is irradiated onto the GaN layer 152 of the layered product 15a (S403). Luminescence is generated at the defective part of the GaN layer 152 onto which the excitation light is irradiated. This is because the yellow band of the nitride semiconductor thin film at the defective part corresponding to the structural defect of the SiC substrate 151 is excited by the irradiation of the excitation light, and luminescence is generated at around wavelength 500-600 nm. The nitride semiconductor material, called a "wide bandgap" material, is transparent to the visible light. Therefore the visible light can be irradiated not only onto the defects on the surface layer of the nitride semiconductor thin film, but also onto the defects existing inside.

Then the density of the luminescence from the GaN layer 152, when the image is formed by the second lens 22, is observed by the naked eye and the position of the defective part is specified (S405). After this, the excitation light is irradiated onto the entire face of the GaN layer 152 by moving the stage manually or automatically, so as to specify the position of the defective part (that is, defective position) on the entire surface of the wafer type SiC substrate 151.

In this way, to use an SiC substrate for a device, the quality of the SiC substrate can be easily evaluated by a simple configuration using an optical microscope.

Therefore the problem, where the structural defects of the SiC, which has better thermal conductivity than a sapphire substrate, cannot be specified before fabricating the device, can be solved, and an improvement in yield in manufacturing devices using a SiC substrate can be expected.

As the above description clearly shows, according to the present embodiment, a position of the defective part of the SiC substrate can be detected by the naked eye through the lens by using the luminescence phenomena generated based on the defect of the nitride semiconductor thin film.

In other words, the position of the defect of the SiC substrate, that causes defect propagation to the nitride semiconductor thin film, can be specified.

Second Embodiment

In this embodiment, a mercury lamp, which can irradiate ultraviolet light, is used as the light source of the substrate inspection device, which is a major difference from the first embodiment.

In this configuration example, a mercury lamp, which can irradiate ultraviolet light, is used rather than the light source described in the first embodiment. In this case, the excitation light is an i-line (wavelength 365 nm) or j-line (wavelength 313 nm).

In the case of the first embodiment, the entire surface of the sample is brightly lit since visible light is irradiated as the excitation light. Therefore when the defective part of the SiC substrate is observed by the density difference of the luminescence using the naked eye, the density difference of the luminescence, due to blockage by dirt and dust attached to the surface of the sample, may make it difficult to distinguish whether it is a defective part or not.

If ultraviolet light is irradiated as the excitation light, on the other hand, the surface of the sample is not brightly lit to the naked eye when observed. In other words, only the luminescence from the GaN layer 152 can be observed by the naked eye. As a result, when luminescence from the GaN layer 152 is blocked by dirt or dust attached to the surface of the sample, luminescence intensity becomes weaker only at that blocked portion, which can be clearly observed. Dirt or dust in this case, includes not only particles attached to the surface of the sample during transport, but also includes crystals which are generated during the crystal growth of the nitride semiconductor, such as a GaN layer, which attach unexpectedly to the surface of the sample.

As the abovementioned description clearly shows, according to this embodiment, dirt or dust attached to the surface of the sample can be detected at the same time, in addition to an effect similar to the first embodiment.

As a result, dirt and dust on the surface of the sample, which causes a drop in the reliability of the device, along with the structural defects of the SiC substrate, can be removed, and therefore further improvement of reliability of the device can be expected.

Third Embodiment

Figure 3:
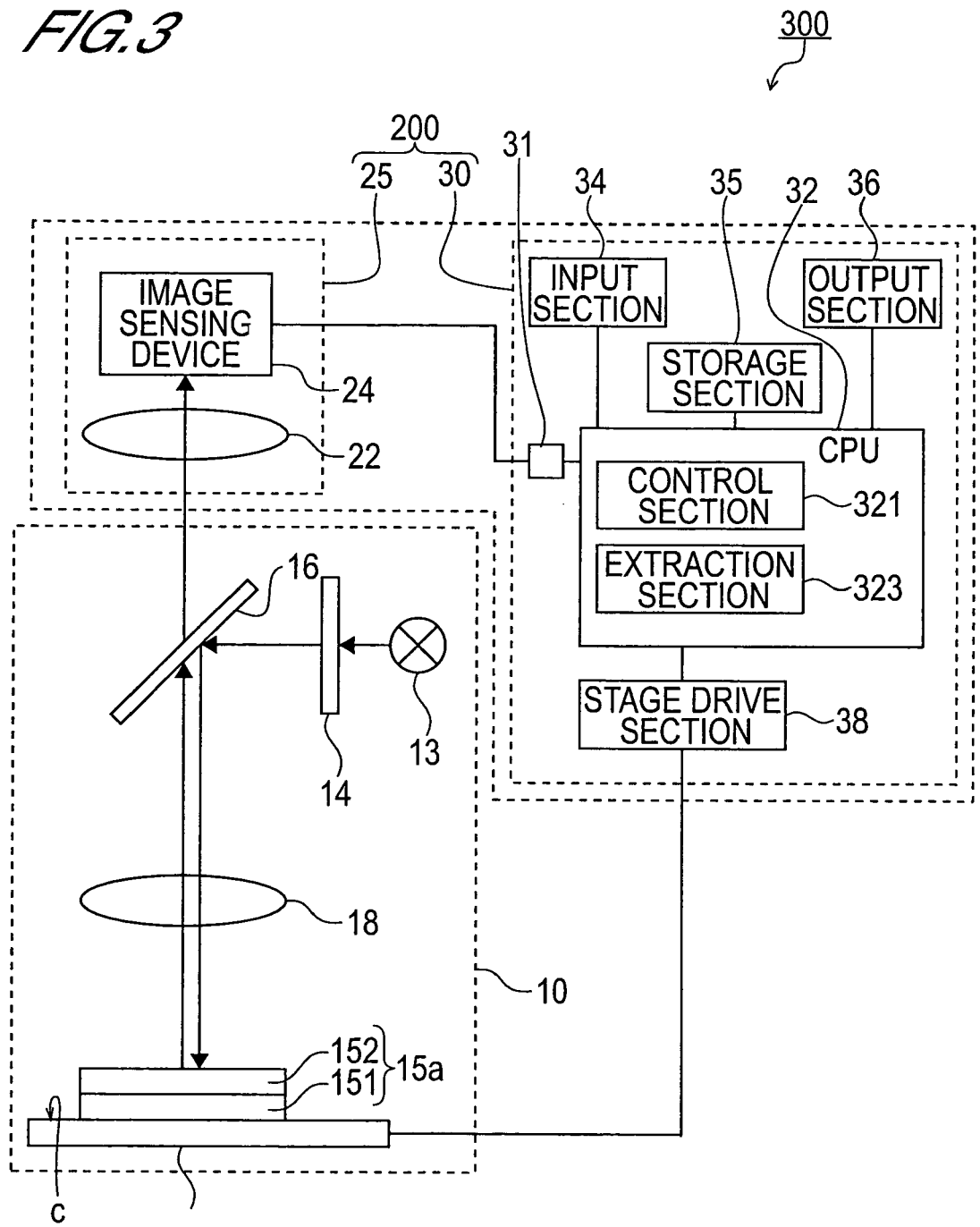
FIG. 3 is a diagram depicting the configuration of the substrate inspection device according to the third embodiment of the present invention.

The substrate inspection device 300 of this embodiment comprises the information acquisition section 25 and the information processing section 30, as the defective part specification section 200, which is a major difference from the first embodiment. In FIG. 3, constitutional elements the same as the constitutional elements described in the first embodiment are denoted with the same reference numerals, and a concrete description thereof will be omitted (this is the same as for each embodiment herein below).

As FIG. 3 shows, the substrate inspection device 300 of this embodiment comprises the excitation light irradiation section 10 and the defective part specification section 200, just like the first embodiment, but the difference is that this defective part specification section 200 further comprises the information acquisition section 25 and the information processing section 30.

In the information acquisition section 25, the surface area of the inspection target SiC substrate is divided into a plurality of inspection blocks, and information on the intensity of the light (hereafter called luminance intensity) generated from the GaN layer of each inspection block, is acquired, and in the information processing section 30, a retrieval block, of which the intensity of light is a reference value or above, is specified from the information acquired by the information acquisition section 25. Here information on the luminance intensity is information acquired for each retrieval block.

Now the substrate inspection device 300 will be described in detail. Here the excitation light irradiation section 10 is the same as that of the first embodiment, so a concrete description thereof is omitted, and the information acquisition section 25 and information processing section 30 of the defective part specification section 200 will be described in detail.

The information acquisition section 25 is comprised of a second lens 22 and image sensing device 24, such as a CCD camera. The light emitted from the layered product 15a, of which an image is formed by the second lens 22, is acquired as image data, which is information on the intensity of light in the image sensing device 24 comprising a plurality of pixels. Each of the pixels corresponds to each of the above-mentioned retrieval blocks in one-for-one relation.

The information processing section 30 is comprised of the information reception section 31, CPU (or Central Processing Unit) 32, input section 34, storage section 35, output section 36 and stage drive section 38.

The information reception section 31 receives the above-mentioned information on the light intensity, which the information acquisition section 25 acquired as digital signals, as image data. The information received here is first stored in the storage section 35.

The CPU functions as a means of implementing various functions when software processing is executed by programs. The CPU 32 in this configuration example includes the functional means which functions as the control section 321 and extraction section 323 (also called mapping processing section), to be described later respectively.

The control section 321 performs control for execution of processing of the predetermined functional means, control for displaying data on the output section 36, and control for keeping the timing of each composing element based on the instruction which is input from the input section 34 or the instruction generated inside the CPU 32, and details on these aspects, which have been known, will be omitted.

The extraction section 323 executes mapping processing, wherein the light intensity of each retrieval part which is acquired from the information on the intensity of light on the entire surface of the sample, is compared with one or more thresholds which are set in the storage section 35 as reference values, and the area of which the intensity of light is the reference value or above is extracted as a defective part. By this mapping processing, the mapping data, which is data on the defective position and non-defective position of the GaN layer 152, can be acquired quickly with good reproducibility.

The input section 34 is a device comprising an input means such as a keyboard and touch panel, for inputting the necessary instruction from the outside during processing.

The storage section 35 is a storage device comprising such a memory as RAM and ROM, where the information and data required for processing of this invention are written so as to be read out freely, and information and data generated during each processing are written so as to be read out freely.

The output section 36 is comprised of an image display device (monitor) for displaying the required information and data from the information reception section 31 and input section 34, and required information and data generated during processing by the CPU 32, and/or the printing device.

The stage drive section 38 can move the stage 12 in a direction in parallel with the sample mounting face c and a direction vertical to the mounting face c of the stage 12 based on an instruction signal from the input section 34. In this configuration example, the stage 12 is moved to a predetermined position and luminescence from the layered product 15a is observed, but the stage 12 may be fixed instead, so that the image sensing device 24 is moved to a predetermined position and luminescence from the layered product 15a is observed.

Figure 4:
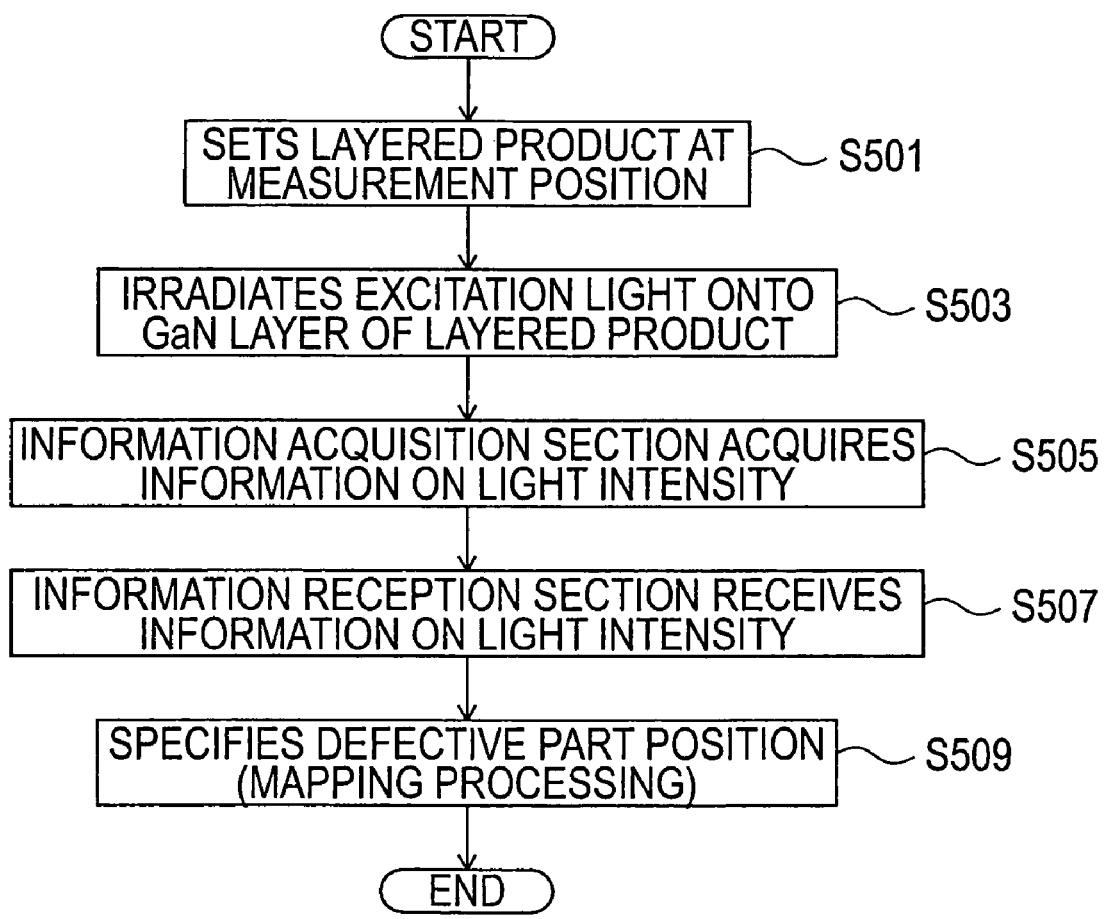
FIG. 4 is a flow chart depicting the inspection method using the substrate inspection device of the third embodiment of the present invention.

Now the substrate inspection method using the substrate inspection device 300 will be described with reference to FIGS. 3 and 4.

At first, the stage 12, on which the wafer type layered product 15a is placed, is set at the measurement position, which is the observation start position, by the image sensing device 24 (S501).

Then the excitation light is irradiated onto the GaN layer 152 of the layered product 15a in a method the same as the first embodiment (S503). In the defective part of the GaN layer 152 onto which the excitation light is irradiated, luminescence is generated as described in the first embodiment. As the light source, the abovementioned mercury lamp that can irradiate blue to green visible light (wavelength about 400 to 600 nm) and ultraviolet light are used.

Then, according to this embodiment, an image of the light generated from the GaN layer 152 is formed by the second lens 22, and is converted into the information on the intensity of the light by the image sensing device 24, and is acquired (S505). After acquiring the information on the intensity of the light at the observation start position, a control signal for moving the stage 12 is automatically output from the control section 321 to the stage driving section 38. By this control signal, the stage 12 is moved to the next measurement position, and new information is acquired in the same way by the image sensing device 24. Repeating such processing moves the stage 12 so that the image sensing device 24 scans the entire surface of the GaN layer 152. In this way, information on the entire surface of the wafer can be acquired.

Responding to the acquisition of information on the intensity of light, the information reception section 31 receives this information from the information acquisition section 25, and sequentially stores it in the storage section 35 (S507).

Then according to the instruction from the input section 34, the information reception section 31 performs mapping processing for extracting an area of which the intensity of light is at least a predetermined value as a defective part, that is, a defective position, based on the information on the intensity of the light emitted from the GaN layer 152 (S509). Based on the mapping data acquired in this way, the presence of defects of the SiC substrate can be automatically specified.

Figure 5:
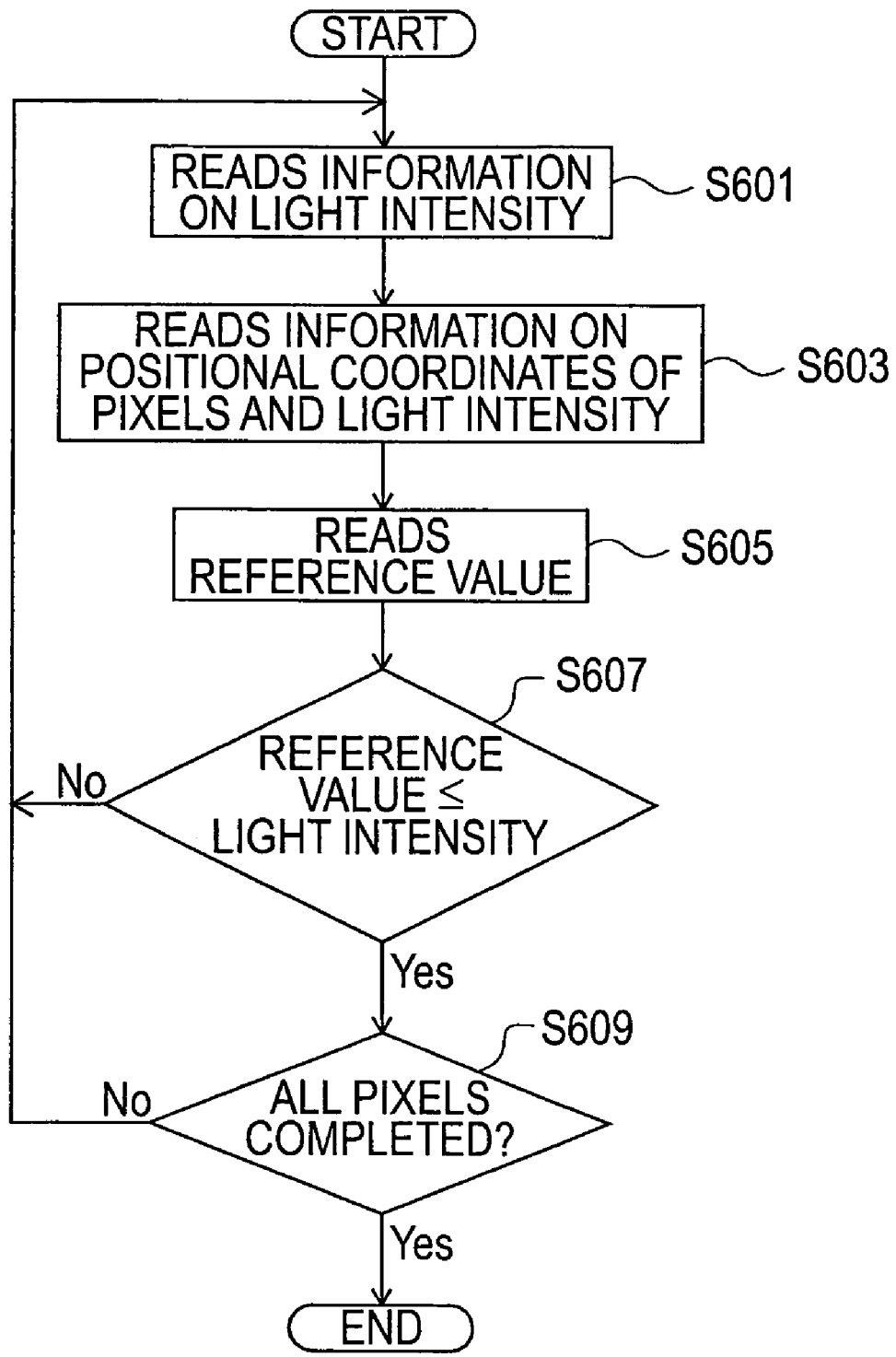
FIG. 5 is a flow chart depicting the operation of the extraction section of the substrate inspection device of the third embodiment of the present invention.

An example of mapping processing in the extraction section 323 will be described with reference to FIG. 5.

At first, as a pre-processing of mapping extraction, the positional coordinates of each retrieval block and the threshold to be the extraction criteria of the light intensity of each retrieval block are stored in the storage section 35 in advance, as described herein below.

If a defect is generated in the SiC substrate 151, a defect is also generated on the GaN layer 152 thereon because of the above defect. Therefore the excitation light is irradiated onto the GaN layer 152 and it is examined in advance how the light intensity of the reflected light thereof changes between the retrieval block area without a defect and the retrieval block area with a defect, as statistical data, and a value of light intensity is acquired as a reference value, that is a threshold, so that the area can be judged as a defective area if the light intensity of this area is at least this predetermined value. The reference value acquired in this way is stored in the storage section 35 as a common reference value for the judgment of each retrieval block. Also in the storage section 35, positional coordinates on the XY coordinate system, which is set on the wafer surface, are stored corresponding to each retrieval block.

The extraction section 323 receives the notice of the end of acquiring information on the intensity of light emitted by the GaN layer 152 for the entire wafer surface, reading this information from the storage section 35 (S601). From this information, the positional coordinates of the pixel and the data of light intensity of this pixel are read for each pixel (S603). Then responding to the read of this information, the reference value is read from the storage section 35 (S605). After this reading of the reference value ends, the reference value and the light intensity are compared (S607). In this comparison, if the light intensity is the same as the reference value or is greater than the reference value (in the case of "YES"), it is judged the coordinates of a pixel corresponding to the retrieval block which emitted this light intensity is a position where the substrate has a defect. If the value of the light intensity is smaller than the reference value (in the case of NO), on the other hand, it is judged that no defect of the substrate exists at a position in the coordinates of the retrieval block which emitted this light intensity. In this way, the abovementioned steps S601-S607 are executed for the retrieval blocks corresponding to all areas of the wafer (S609), and this processing ends. And if necessary, the acquired mapping data can be visualized by printing it out from the output section 36, or by displaying the mapping data on the monitor.

By performing the abovementioned mapping processing, the mapping data on the defective position and non-defective position of the nitride semiconductor thin film can be acquired quickly with good reproducibility.

As the above description clearly shows, according to the present embodiment, an effect similar to the first embodiment can be implemented.

Also according to the present embodiment, the position of the defective part of the SiC substrate can be specified automatically and efficiently.

Fourth Embodiment

At first, a manufacturing method for a nitride semiconductor device of the present embodiment will be briefly described with reference to FIGS. 6 (A), 6(B) and 6(C). This manufacturing method, for example, comprises the following manufacturing steps (1)-(3).

Figure 6A:
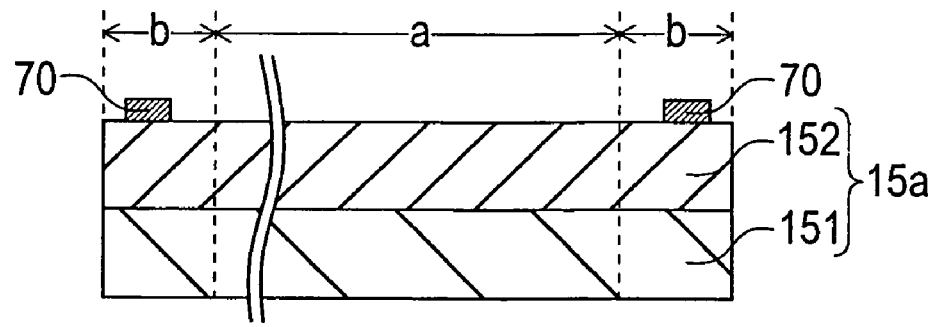
FIG. 6 is a series of diagrams depicting the manufacturing method for a nitride semiconductor device of the fourth embodiment of the present invention.
Figure 6B:
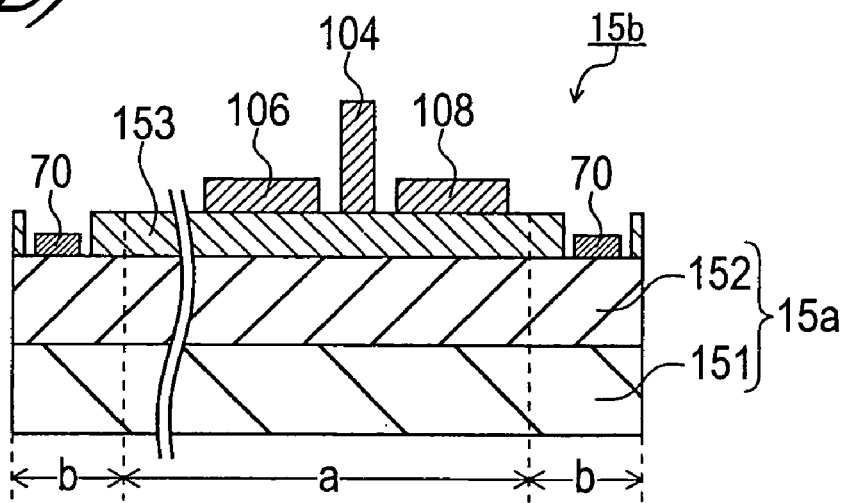
Figure 6C:
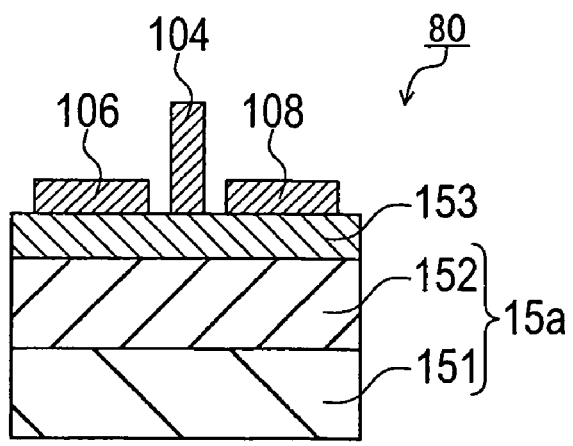

(1) As FIG. 6 (A) shows, the GaN layer 152 to be a channel layer is formed on the wafer type SiC substrate 151, as the nitride semiconductor thin film, to form the layered product 15a. Specifically, the GaN buffer layer (not illustrated), which was formed by the MOCVD method, is modified to the GaN layer 152 and formed on the SiC substrate 151. This layered product 15a may be called a wafer or pre-processing wafer herein below. The GaN type HEMT to be described here has a general structure, and the description of the specific formation method for the crystal growth of each layer, which is already known, will be omitted.

After forming the GaN layer 152, a mark 70, which can be identified from the outside, such as a symbol or number for identifying an individual wafer, is created on the surface of the layered product 15a. The mark 70 is created by depositing aluminum (Al), for example, in the margin area b, which is an area outside the device formation area a on the wafer surface. The mark 70 may be formed as convex or concave by etching the surface of the GaN layer 152, rather than by the metal deposition method. This mark 70 may also be used as the alignment mark for a photo mask, which is used in the HEMT manufacturing step. In other words, the position, count and shape of the mark 70 can be designed freely according to the purpose and design.

(2) As FIG. 6 (B) shows, this layered product 15a is processed so that the mark 70 can be maintained in a status to be identifiable, and the processed layered product 15b is obtained. In this configuration example, a GaN type HEMT 15b, for example, is created into the layered product 15a as the nitride semiconductor device.

Processing on the layered product 15a is not limited to the above example. All that is needed to process is depositing a film for forming the nitride semiconductor device on the GaN layer 152 by a required processing, then removing a part of the deposited film covering the mark 70 so as to expose the mark 70. In this configuration example, the electronic supply layer 153 and each electrode (gate electrode 104, source electrode 106 and drain electrode 108), which are required composing elements of the nitride semiconductor device, are formed on the GaN layer 152. Specifically, the electronic supply layer 153 is created by forming an $Al_{0.2}Ga_{0.8}N$ layer by the MOCVD method. The gate electrode 104 is formed by sequentially layering nickel (Ni) and gold (Au) on the electronic supply layer 153. The source electrode 106 and drain electrode 108 are formed by layering titanium (Ti), aluminum and gold sequentially on the electronic supply layer 153 at positions which sandwich the gate electrode 104 without contact.

Then, as is already known, the passivation film (not illustrated) is formed so as to cover each created composing element. The layered product 15b may be called a processed layered product or processed wafer, and a layered product 15a may simply be referred to as a wafer.

(3) As FIG. 6 (C) shows, the layered product 15b is diced along the dicing layer by the scribing method or dicing method, and the chips 80 are obtained.

In the manufacturing method comprising the above-mentioned manufacturing steps, according to this embodiment of the present invention specifies the position of the defective part (defective position) of the waver type SiC substrate in advance in the status of the pre-processing wafer in the stage of the above step (1). By this, when the processed wafer is diced into chips, the chip having a defective part can be eliminated based on the information on this defective position.

Now the manufacturing device 900 of the nitride semiconductor device will be described in detail with reference to FIG. 7.

Figure 7:
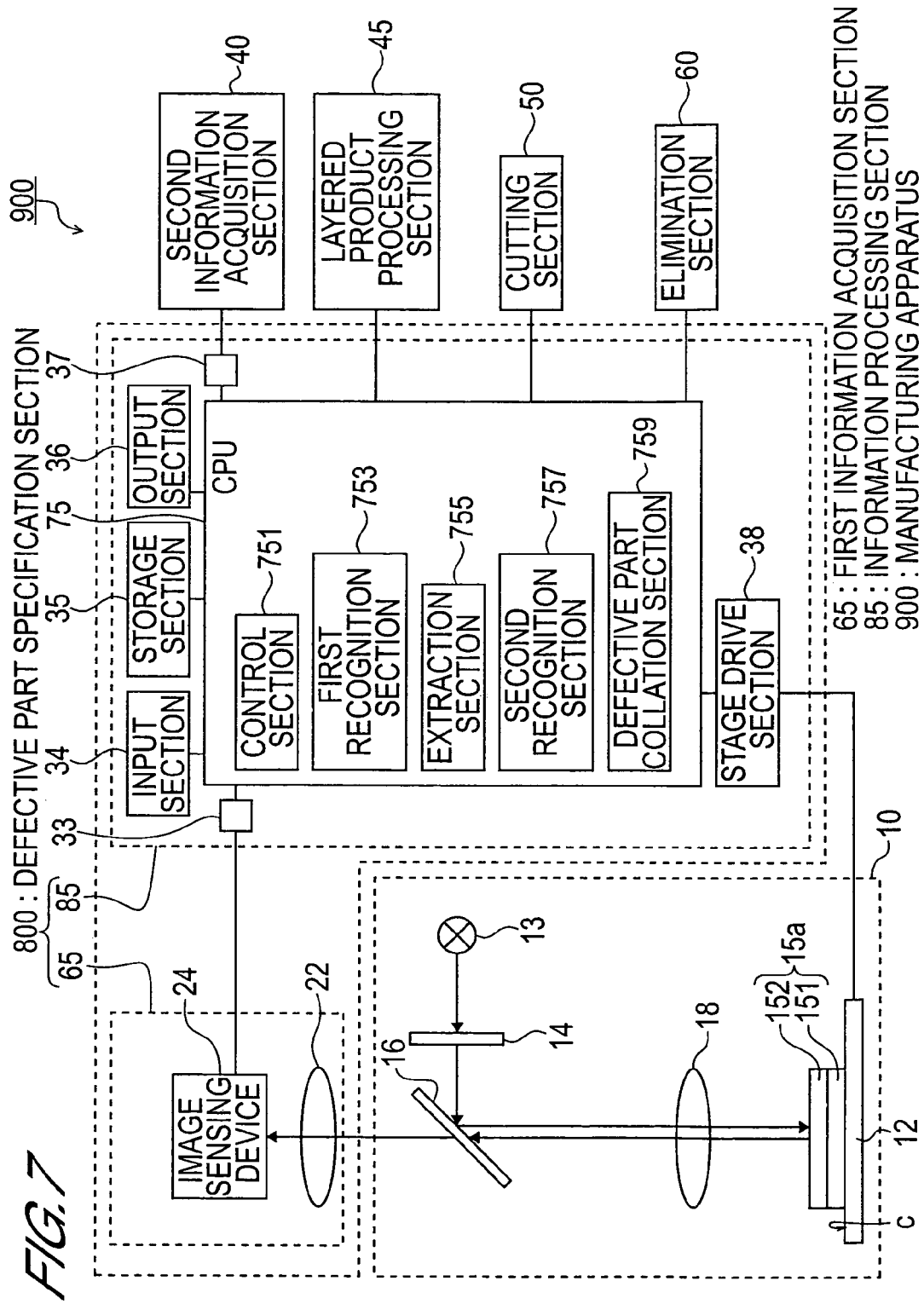
FIG. 7 is a diagram depicting the configuration of the manufacturing apparatus of the nitride semiconductor device of the fourth embodiment of the present invention.

FIG. 7 is a diagram depicting the configuration of the manufacturing apparatus 900 of the nitride semiconductor device of the present embodiment. In this embodiment, the mapping data described in the third embodiment is stored in association with the wafer type sample for which this mapping data is acquired, so as to use this mapping data for manufacturing the nitride semiconductor device.

As FIG. 7 shows, the manufacturing device 900 of the nitride semiconductor device of this embodiment further comprises the second information acquisition section 40, layered product processing section 45, cutting section 50 and elimination section 60, in addition to the excitation light irradiation section 10 and defective part specification section 800, just like the first embodiment.

Now the manufacturing device 900 of the nitride semiconductor device will be described in detail. In this embodiment, the case when the nitride semiconductor device is a GaN type HEMT will be described as an example.

The excitation light irradiation section 10 has a similar configuration as the first embodiment, so a concrete description here is omitted and the defective part specification section 800, second information acquisition section 40, layered product processing section 45, cutting section 50 and elimination section 60 will be described in detail.

The defective part specification section 800 of this configuration example further comprises the first information acquisition section 65 and information processing section 85.

The first information acquisition section 65 comprises a second lens 22 and an image sensing device 24, such as a CCD camera. This first information acquisition section 65 acquires the light emitted from the layered product 15*a*, of which an image is formed by the second lens 22, as the first information on the intensity of the light by the image sensing device 24.

The information processing section 85 comprises a first information reception section 33, CPU 75, input section 34, storage section 35, output section 36, stage drive section 38 and second information reception section 37.

The first information reception section 33 receives the abovementioned first information on the intensity of light, which the first information acquisition section 65 acquired as digital signals, as image data. The first information received here is stored once in the storage section 35.

The second information reception section 37 receives the second information on the mark 70 of the processed layered product 15*b*, acquired by the later mentioned second information acquisition section 40, as image data.

The CPU 75 has the same functions as the third embodiment, and in this case comprises a functional means which functions as a control section 751, first recognition section 753, extraction section (mapping processing section) 755, second recognition section 757, and defective part collation section 759, which will be described later.

The control section 751 controls the execution of processing of the other required functional means, controls write and/or read of information and data for the storage section 35, controls for displaying the output of the signals to the output section 36, and controls the timing of each composing element based on the instruction which was input from the input section 34 or the instruction generated inside the CPU 75.

The first recognition section 753 recognizes a mark 70 formed on the layered product 15*a* based on the first information which the first information reception section 33 received.

Figure 8:
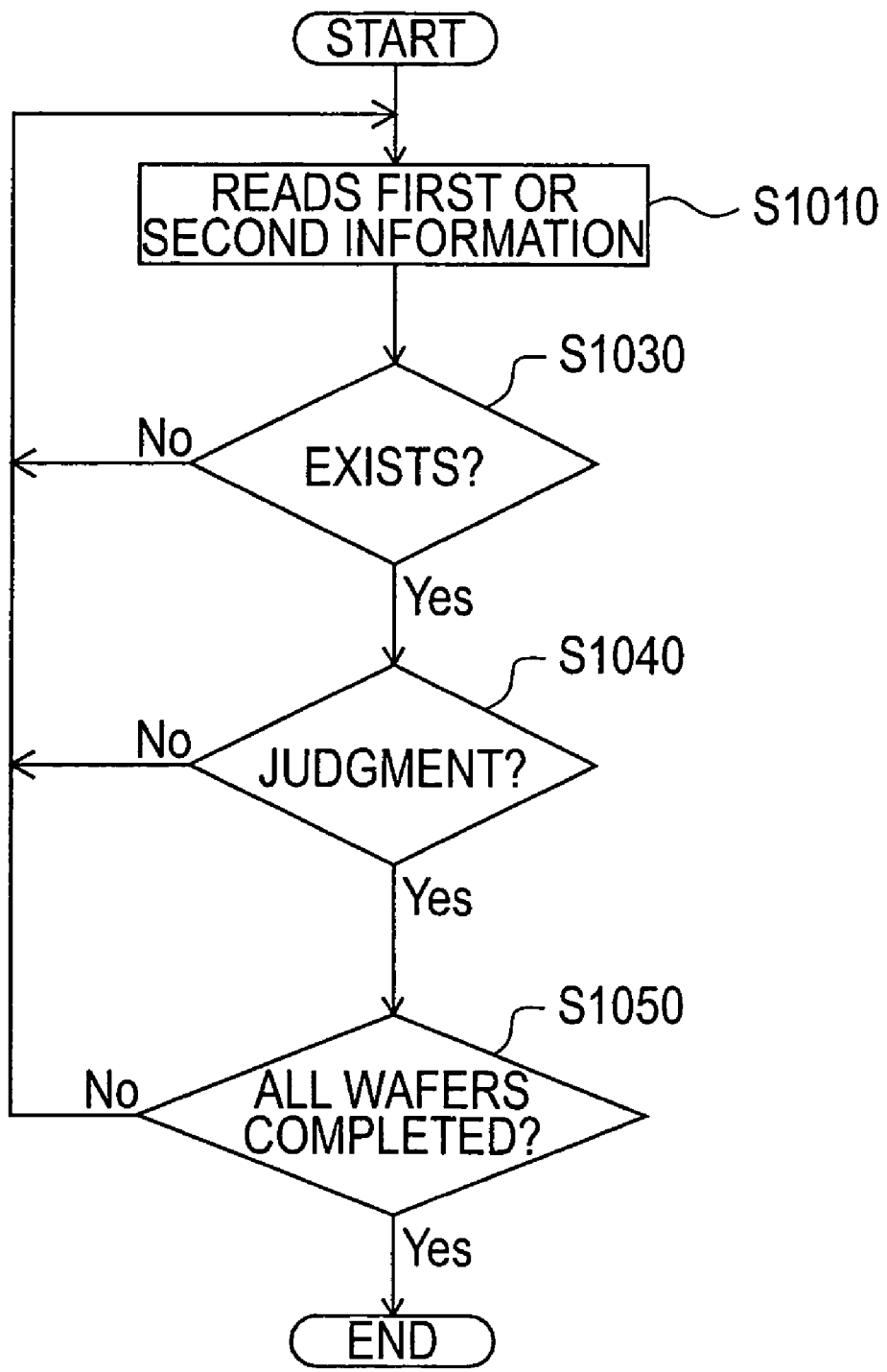
FIG. 8 is a flow chart depicting the operation of the first and second identification sections of the manufacturing device for a nitride semiconductor apparatus of the fourth embodiment of the present invention.

Now an example of the recognition processing operation by the first recognition section will be described with reference to FIG. 8.

At first, information on a true reference mark (that is a mark formed in the abovementioned step (1)) for each wafer is stored in the storage section 35 in advance as the pre-processing of the recognition processing.

The first recognition section 753 reads the first information from the storage section 35 for each pixel responding to the reception of the first information by the first information reception section 33 (S1010).

It is judged whether the information on the mark 70 for wafer identification formed for each wafer exists in the first information which was read (Y: "YES") or not (N: "NO") (S1030).

If information on the mark 70 in the first information exists (Y), it is judged which one of the reference marks of the wafer the mark 70 is (S1050).

This judgment is performed by collating the reference marks of the wafer stored in the storage section 35 and the information on the mark which was read from the first information. If collation matches (Y), the mark which was read is recognized as a true identification mark, and is stored in the storage section 35 in association with the first information on the mark of the layered product 15*a* and the pre-processing mapping data. In each step S1030 and S1050, if the judgment is "NO" or "Mismatch", that is if (N), then processing returns to S1010. When each step S1010 to S1050 ends for all the retrieval blocks, the recognition processing operation ends.

The extraction section 755 has a function similar to the third embodiment. The extraction section 755 compares the light intensity of each pixel, which is acquired from the first information on the intensity of light from each retrieval block on the entire face of the sample, and one or more of the thresholds of the light intensity which is set as a reference value in the storage section 35 in advance. In this way, the extraction section 755 performs mapping processing for extracting the area of which the intensity of light is the reference value or above as a defective part. This mapping processing can be executed by a same method as the third embodiment. Here a defective area of the wafer is stored in the storage section 35 as positional coordinate information for each wafer 15*a*.

The second recognition section 757 recognizes the mark 70 formed on the processed layered product 15*b* based on the second information received by the later mentioned second information reception section 37. This processing is substantially the same as the recognition processing in the first recognition section 753, which was described with reference to FIG. 8. In this case, the layered product is a processed layered product (that is, processed wafer) 15*b*, and processing is performed on the second image data, instead of the first image data. Therefore in FIG. 8, the step S1010 is the processing for the second image data.

The defective part collation section 759 specifies the position of the defective part of the processed layered product 15*b* based on the first information.

Now an example of the defective position specification processing for the processed layered product 15*b* in the defective part collation section 759 will be described with reference to FIG. 9.

Specifically, the mark 70 recognized by the second recognition section 757 and the mark 70 stored in the storage section 35 along with the mapping data based on the first information are collated (S1110). If collation matches (Y), the mapping data on the defective part of the SiC substrate of the pre-processing layered product 15*a*, having the matched mark (S1130) is read. The positional coordinates of the location of the defective part included in the pre-processing mapping data is specified (S1150). By this specification of the positional coordinate of the defective part, the positional coordinate of the area where the defective part is generated in the processed layered product 15*b* is specified.

These steps S1110-S1150 are executed for the entire wafer, that is the layered product (S1170). If the result is NO in steps S1110 and S1170, processing returns to S1110.

By this, the defective position of the SiC substrate 151, which causes defect propagation to the GaN layer 152, can also be specified in the status of the processed layered product 15b.

The second information acquisition section 40 has an ordinary image sensing device, which comprises a plurality of pixels with a similar configuration used for a CCD camera, for example. The second information acquisition section 40 acquires the second information on the mark 70 formed on the layered product 15b. This second information acquisition section 40 may be formed in the configuration of the excitation light irradiation section 10 of the above described substrate inspection device 100 (see first embodiment), where the light source 13 composing element thereof, is not removed or is removed.

The layered product processing section 45 is a conventional device which performs film deposition and etching on the layered product 15a to create the nitride semiconductor device as the final device, and may be a standalone configuration or may be combined with other pluralities of devices.

The layered product processing section 45 also performs processing for removing the film portion covering the mark 70 to expose this mark 70.

After the above mapping data is acquired, the required processing by the layered product processing section 45 is started by an instruction from the input section 34 after the pre-processing layered product 15a is automatically transported to the layered product processing section 45.

By this processing, the layered product 15a becomes the processed layered product 15b, where the mark 70 is maintained in the status to be identifiable from the outside. Here the layered product 15a is processed and a wafer type GaN type HEMT 15b is created. When this processing ends, the processed layered product 15b is automatically transported to the second information acquisition section 40 by an instruction from the input section 34, and is set at a predetermined position.

In the cutting section 50, the mark 70 of the processed layered product 15b and the positional coordinate information of the defective part of this processed layered product 15b are stored in the storage section 35, then the processed layered product 15b is automatically transported to the cutting section 50, and is set at a predetermined position. Responding to the end of this setting, the cutting section 50 cuts the processed layered product 15b along the dicing lines, and separates it into a plurality of chips. After this step, each chip is still secured on the dicing tape.

Among the plurality of chips which were cut by the cutting section and remain attached to the dicing tape, the elimination section 60 eliminates a chip in an area which was judged as a defective part by the defective part collation section 759 by a robot arm with tweezers, for example. Specifically, the elimination section 60 reads the positional coordinate information on the defective position of the SiC substrate of the processed layered product 15b, and specifies and eliminates the defective chip.

Now method of the manufacturing a nitride semiconductor device using the manufacturing apparatus 900 for a nitride semiconductor device will be described with reference to FIG. 6 to FIG. 10.

At first, the stage 12, on which the wafer type layered product 15a is placed, is set at the observation start position by the image sensing device 24 (S1510).

Then by the same method as the first embodiment, the excitation light is irradiated onto the GaN layer 152 of the layered product 15a (S1530). At this time, in the defective part of the GaN layer 152 onto which the excitation light is irradiated, luminance is generated, just like the case of the first embodiment. For the light source, the above-mentioned mercury lamp, which can irradiate blue to green visible light (wavelength about 400 to 600 nm) and ultraviolet light are used.

Then the luminescence from the GaN layer 152, of which image is formed by the second lens 22, is converted into the first information and is acquired by the image sensing device 24 (S1550). After the first information is acquired at the observation start position, a control signal for moving the stage 12 to the stage drive section 38 is automatically output from the control section 751. By this control signal, the stage 12 is moved to the next measurement position, and new first information is acquired in the same way by the image sensing device 24. By repeating this scanning process, the image sensing device 24 scans the entire surface of the GaN layer 152, and acquires information on the intensity of the light on the entire surface of the wafer, that is the first information. At this time, the first information includes information on the abovementioned mark 70 in addition to the information on the intensity of the light emitted from the GaN layer 152.

Responding to the acquisition of the first information, the first information reception section 33 receives the first information from the first information acquisition section 65, and stores it in the storage section 35 (S1570).

Then the first information is read from the storage section 35 by an instruction from the input section 34, and the mark 70, formed on the pre-processing layered product 15a, is recognized based on this first information (S1590).

Then based on the first information of the layered product 15a corresponding to the recognized mark 70, mapping processing, for extracting the area of which the intensity of light is at least a predetermined value as a defective part, that is a defective position, is performed by an instruction from the input section 34 (S1610).

Then the mark recognized by the first recognition section 753 and the mapping data on this mark 70 are associated and stored in the storage section 35 by an instruction from the input section 34 (S1630).

In this way, by storing and managing the data on the defective position and non-defective position for each wafer as mapping data, the information can be read when necessary. Here the recognized mark and mapping data on this mark are associated and stored in the storage section 35. However, instead of this, the recognized mark and the first information on this mark may be associated and stored, and mapping processing may be performed on this first image data in a latter step. Or if necessary, the mapping data may be read from the storage section 35, and displayed as an image in the output section 36.

Then the layered product 15a is transported to the layered product processing section 45 by an instruction from the input section 34, so as to create the nitride semiconductor device. If the mark 70 is covered with some film after this device is created, the portion of the film covering the mark 70 is removed. In this way, that is the GaN type HEMT 15b, where the mark 70 remains in a status to be identifiable from the outside, is created (S1650).

Then the processed layered product 15b is set at the observation start position to acquire the second information on the mark 70 of the processed layered product 15b (S1670).

Then the image sensing device (not illustrated) scans the entire surface of the processed layered product 15b, and the second information on the mark 70 of the processed layered product 15b is acquired (S1690).

Then, responding to the acquisition of the second information, the second information reception section 37 receives the second information from the second information acquisition section 40, and stores it in the storage section 35 (S1710).

Then the second information is read from the storage section 35 by the instruction from the input section 34, and the mark 70 of the processed layered product 15b is recognized (S1730).

Then the position of the defective part, that is the defective position, of the GaN layer 152 of the processed layered product 15b is specified (S1750). Specifically, the mapping data which is stored associated with a mark 70, the same as the mark recognized by the second recognition section 757, is read from the storage section 35 by an instruction from the input section 34. And based on the mapping data which was read, the defective position of the GaN layer 152 of the processed layered product 15b is judged. In this way, the defective position of the SiC substrate, in the status of the processed layered product 15b, can be specified using the mapping data which was acquired in advance before processing the layered product.

Then the processed layered product 15b, attached to the dicing tape, is cut into individual chips 80 (S1770).

Then a chip, including an area judged as a defective part by the defective part collation section 759, is picked up by tweezers installed at the tip of a robot arm, and is eliminated (S1790).

In this way, the chip having a defective part can be selected by the mapping data which has been acquired in advance, and a reliability evaluation inspection need not be performed again for the individual chip which was cut.

As the above description clearly shows, according to the embodiment of the present invention, effects similar to the first embodiment can be implemented.

Also according to the present invention, the position of the defective part of the SiC substrate of the wafer type processed layered product can be specified using the mapping data which was acquired before processing the layered product in advance, so it is unnecessary to specify the defective position again after processing.

Therefore among the chips acquired by cutting the processed layered product, chips having the defective part in the SiC substrate can be efficiently selected.

The configuration of the present invention is not limited to the above embodiments. In other words, this invention can be applied in any steps under suitable conditions.

For example, for the light source, a xenon lamp or halogen lamp can be used freely, other than the mercury lamp.

The case when the GaN layer is used for the nitride semiconductor thin film was described, but a film can be used if at least one of a GaN layer, AlGaN layer and InGaN layer is included.

For the nitride semiconductor device using the nitride semiconductor thin film, a high frequency and high output transistor, blue laser and blue light emitting diode can be freely used other than HEMT.

In the abovementioned description, each processing for the pre-processing layered product or processed layered product is performed by an instruction from the input section, but may be started automatically.

In the description on the abovementioned fourth embodiment, the defective part specification section, and the layered product processing section, cutting section and elimination section are connected via the control device, but the configuration is not limited to this. Therefore the layered product processing section, cutting section and elimination section may be separated from the control device and installed as independent devices. In this case, the required information acquired by the control device may be stored in a predetermined storage section in advance, so that this information can be used for the layered product processing section, cutting section and elimination section via this storage section.

In the fourth embodiment, the entire surface of the layered product is processed, and the position of the defective part of the SiC substrate of the finished processed layered product is specified using the mapping data which has been acquired before processing the layered product in advance, so as to eliminate unnecessary chips having a defective part.

However, processing on the layered product may be performed only on the SiC substrate portion which does not having defective parts, based on the mapping data, so that after cutting the layered product, chips other than the chips that include the processed layered product are eliminated.

What is claimed is:

1. An apparatus for manufacturing a nitride semiconductor device, comprising:
   an excitation light irradiation section configured to irradiate excitation light onto a nitride semiconductor thin film out of a layered product wherein said nitride semiconductor thin film is deposited on a silicon carbide substrate;
   a defective part specification section configured to specify a position of a defective part of said silicon carbide substrate based on the defects of said silicon carbide substrate generated in said nitride semiconductor thin film by said excitation light;
   a layered product processing section configured to process an area other than said defective part among said layered product and forming a processed layered product;
   a cutting section configured to cut said layered product including said processed layered product at each predetermined device dimension to create a plurality of chips; and
   an elimination section configured to eliminate chips other than the chips including said processed layered product from said chips.

2. The apparatus for manufacturing a nitride semiconductor device according to claim 1, wherein said defective part specification section further comprises a first information acquisition section configured to detect said light and acquire a first information including information on the intensity of said light, and an information processing section configured to specify an area where the intensity of said light is equal to or exceeds a reference value of said defective part from said first information.

3. The apparatus for manufacturing a nitride semiconductor device according to claim 1, wherein when said layered product on which a mark that can be identified from an outside of said nitride semiconductor device is used, said apparatus for manufacturing a nitride semiconductor device comprising a second information acquisition section configured to acquire second information on said mark formed on said processed layered product, and
   wherein said defective part specification section comprises:
   a first recognition section configured to recognize said mark from said first information;
   a storage section configured to store said first information and said mark recognized in said first recognition section associating with each other;
   a second recognition section configured to recognize said mark of said processed layered product, based on said second information acquired by said second information acquisition section; and
   a defective part collation section configured to read and collate said first information, which is stored associated with a mark that is the same as the mark of said recognized processed layered product, from said storage section, and specifying a defective part of said processed layered product based on said first information that was read.

4. The apparatus for manufacturing a nitride semiconductor device according to claim 3, further comprising a processing section configured to process the film for forming the nitride semiconductor device on said layered product so that said mark of said processed layered product can be identified from the outside of said nitride semiconductor device, when said mark of said processed layered product is recognized.

5. The apparatus for manufacturing a nitride semiconductor device according to claim 1, wherein said excitation light is visible light having a wavelength of 400 to 600 nm.

6. The apparatus for manufacturing a nitride semiconductor device according to claim 1, wherein said excitation light is ultraviolet light.

* * * * *